(12) United States Patent
Inagaki

(10) Patent No.: US 7,586,134 B2
(45) Date of Patent: Sep. 8, 2009

(54) SEMICONDUCTOR DEVICE WITH ELEMENT ISOLATION STRUCTURE

(75) Inventor: Satoshi Inagaki, Kawasaki (JP)

(73) Assignee: Fujitsu Microelectronics Lmiited, Tokyo (JP)

(*) Notice: Subject to any disclaimer, the term of this patent is extended or adjusted under 35 U.S.C. 154(b) by 0 days.

(21) Appl. No.: 11/362,220

(22) Filed: Feb. 27, 2006

(65) Prior Publication Data

US 2007/0114603 A1    May 24, 2007

(30) Foreign Application Priority Data

Nov. 18, 2005    (JP) ............................ 2005-334754

(51) Int. Cl.
*H01L 21/338* (2006.01)
(52) U.S. Cl. ........................ 257/249; 438/183
(58) Field of Classification Search ................ 257/330, 257/E21.453, 332, 213, 224, 243, 244, 249, 257/368, E21.444; 438/183, 926, 182, 197, 438/270, 271, 585
See application file for complete search history.

(56) References Cited

U.S. PATENT DOCUMENTS

| | | | | |
|---|---|---|---|---|
| 5,571,738 A * | 11/1996 | Krivokapic | ................ | 438/291 |
| 5,599,726 A * | 2/1997 | Pan | ............................. | 438/304 |
| 5,786,255 A * | 7/1998 | Yeh et al. | ..................... | 438/299 |
| 5,886,382 A * | 3/1999 | Witek | .......................... | 257/329 |
| 5,962,894 A * | 10/1999 | Gardner et al. | .............. | 257/330 |
| 6,383,876 B1 * | 5/2002 | Son et al. | ..................... | 438/289 |
| 6,406,950 B1 * | 6/2002 | Dakshina-Murthy | ........ | 438/183 |
| 6,583,012 B1 * | 6/2003 | Buynoski et al. | ............ | 438/275 |
| 6,794,693 B2 * | 9/2004 | Kakamu et al. | ............. | 257/257 |
| 6,798,017 B2 * | 9/2004 | Furukawa et al. | ........... | 257/329 |
| 6,806,534 B2 * | 10/2004 | Dokumaci et al. | .......... | 257/330 |
| 6,849,511 B2 * | 2/2005 | Iriyama et al. | .............. | 438/275 |
| 2003/0183939 A1 * | 10/2003 | Kakamu et al. | ............. | 257/762 |
| 2004/0087114 A1 * | 5/2004 | Xiang et al. | ................. | 438/478 |
| 2004/0219725 A1 * | 11/2004 | Furukawa et al. | ........... | 438/197 |

FOREIGN PATENT DOCUMENTS

JP    2005-232255    9/2005

* cited by examiner

*Primary Examiner*—David Vu
*Assistant Examiner*—Suberr Chi
(74) *Attorney, Agent, or Firm*—Westerman, Hattori, Daniels & Adrian, LLP.

(57) ABSTRACT

When an STI element isolation structure is formed, it is formed in such a manner that its upper portion protrudes further than the surface of a substrate than by a normal STI method, and a dummy electrode pattern is formed in a gate electrode forming portion. After a source/drain is formed in alignment with a gap portion, a conductive layer formed by filling the gap portion with W is formed, the dummy electrode pattern is removed, and a gate insulating film and a gate electrode are formed.

13 Claims, 9 Drawing Sheets

SEMICONDUCTOR DEVICE WITH ELEMENT ISOLATION STRUCTURE

CROSS-REFERENCE TO RELATED APPLICATIONS

This application is based upon and claims the benefit of priority from the prior Japanese Patent Application No. 2005-334754, filed on Nov. 18, 2005, the entire contents of which are incorporated herein by reference.

BACKGROUND OF THE INVENTION

1. Field of the Invention

The present invention relates to a semiconductor device including a gate electrode and a pair of impurity diffusion regions (source/drain) and a manufacturing method of the same.

2. Description of the Related Art

Recently, further scale down and higher integration of a semiconductor device typified by a MOS transistor has been progressing. To respond to further scale down and higher integration, in the MOS transistor, as a technique for forming an element isolation structure, for example, the application of an STI method is proposed. Further, in this case, for example, as disclosed in Patent Document 1, a technique for reducing a resistance by forming a silicide layer on a source/drain in order to suppress an increase in the resistance value of the source/drain resulting from the application of the STI method is applied.

(Patent Document 1)

Japanese Patent Application Laid-open No. 2005-235255

To suppress an increase in junction leakage current by forming the silicide layer on the source/drain and fully reduce the resistance value of the source/drain, it is needed to form the silicide layer relatively thick if the realization of further scale down and higher integration of the MOS transistor is taken into account. However, the thicker the silicide layer is formed, the larger the erosion of the source/drain by a metal (for example, W, Ti, or the like) used for silicidation becomes, whereby it is difficult to form the silicide layer which is thick enough to reduce resistance.

SUMMARY OF THE INVENTION

The present invention is made in view of the aforementioned problem and its object is to provide a semiconductor device which suppresses an increase in junction leakage current without causing erosion of an impurity diffusion region or the like to thereby fully reduce a resistance value of the impurity diffusion region, realizes further scale down and higher integration, and makes a high-speed operation at low power consumption possible and a manufacturing method of the same.

A semiconductor device of the present invention comprises: a semiconductor substrate; an element isolation structure which is formed by filling an isolation trench formed in an element isolation region in the semiconductor substrate with an insulator and in which an upper portion of the insulator protrudes from a surface of the semiconductor substrate; a gate electrode which is formed in an electrode shape over an element active region demarcated by the element isolation structure of the semiconductor substrate with a gate insulating film therebetween; a pair of impurity diffusion regions which is formed by introducing an impurity into a surface layer of the semiconductor substrate over both sides of the gate electrode in the element active region; and a conductive layer which is formed by filling a region between the element isolation structure and the gate electrode over the element active region with a conductive material in such a manner as to be electrically insulated from the gate electrode and electrically connected with the impurity diffusion region, wherein heights of the element isolation structure, the gate electrode, and the conductive layer from the surface of the semiconductor substrate are equal.

A method of manufacturing a semiconductor device of the present invention, comprises the steps of: forming an isolation trench in an element isolation region of a semiconductor substrate and thereafter filling the isolation trench with an insulator to form an element isolation structure in such a manner that an upper portion of the insulator protrudes from a surface of the semiconductor substrate; forming a dummy electrode pattern having an electrode shape over an element active region demarcated by the element isolation structure of the semiconductor substrate; introducing an impurity into a surface layer of the semiconductor substrate over both sides of the dummy electrode pattern in the element active region to form a pair of impurity diffusion regions; filling a region between the element isolation structure and the dummy electrode pattern over the element active region with a conductive material to form a conductive layer which is electrically connected with the impurity diffusion region; removing the dummy electrode pattern; and filling an electrode trench formed in the conductive layer by the removal treatment with a conductive material with a gate insulating film between the semiconductor substrate and the conductive material and in a state electrically insulated from the conductive layer to form a gate electrode, wherein the element isolation structure, the gate electrode, and the conductive layer are formed in such a manner that their heights from the surface of the semiconductor substrate are equal.

DETAILED DESCRIPTION OF THE PREFERRED EMBODIMENTS

Basic Gist of the Present Invention

Figure 1A:
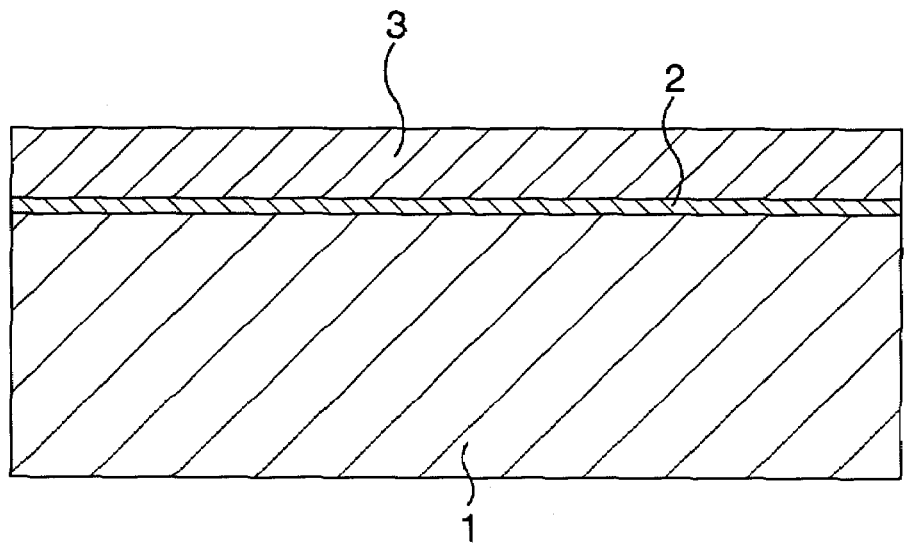
FIG. 1A and FIG. 1B are schematic sectional views showing a manufacturing method of a CMOS transistor according to the present embodiment step by step.

As a method for realizing a reduction in resistance by accurately forming a conductive layer on a source/drain in order to realize further scale down and higher integration of a semiconductor element, a silicide method is normally used as described above. In this method, a low-resistance silicide layer can be formed only on the source/drain (and on a gate electrode) in a self-aligned manner by depositing a metal film over the entire surface of a semiconductor substrate and selectively changing only the quality of a portion on the source/drain (and a portion on the gate electrode).

The present inventor has focused attention on the fact that in the silicide method, erosion of the source/drain is inevitable in compensation for realizing a reduction in the resistance of the source/drain in a self-aligned manner, and to easily and accurately form a low-resistance conductive layer on the source/drain without silicidation, reached a technical idea of forming the low-resistance conductive layer in a self-aligned manner by positively using a so-called STI (Shallow Trench Isolation) method capable of fully carrying out an element isolation function even if the semiconductor element is further scaled down and highly integrated as an element isolation method.

Namely, in the present invention, when an element isolation structure by the STI method (hereinafter described as an STI element isolation structure) is formed, the STI element isolation structure is formed in such a manner that its upper portion protrudes further from a substrate surface than by a normal STI method. Since the height of this protruding portion corresponds to the thickness of the low-resistance conductive layer, the protruding portion is formed to have a desired height so that the thickness of the conductive layer is such that a sufficient reduction in the resistance of the source/drain can be realized.

Subsequently, the source/drain is formed by forming a dummy electrode pattern in a gate electrode forming portion (it is desirable to form it continuously using a mask used when the STI element isolation structure is formed) and introducing an impurity into the surface of a substrate exposed on both sides of the dummy electrode pattern. On this occasion, a gap portion formed between the STI element isolation structure and the dummy electrode pattern is formed on the substrate, and the source/drain is formed in alignment with the gap portion. By filling a low-resistance conductive material such as W, Ti, or the like into the gap portion with a conductive adhesive layer therebetween to a thickness sufficient to fill in the gap portion in this state, and planarizing the surface thereof until the STI element isolation structure is exposed, the conductive layer having a shape which fills the gap portion is formed. This conductive layer is formed on the source/drain in alignment therewith and electrically connected therewith without eroding the source/drain.

Then, the dummy electrode pattern is removed, and a gate insulating film and a gate electrode are formed in sequence with the conductive layer and an insulating film (for example, a sidewall insulating film) therebetween in the portion where the dummy electrode pattern is formed.

As described above, in the present invention, by using the STI element isolation structure, the low-resistance conductive layer with a desired thickness can be formed on the source/drain in a self-aligned manner without eroding the source/drain, which can form the source/drain more shallowly and realize further scale down and higher integration.

Preferred Embodiment to which the Present Invention is Applied

A preferred embodiment in which the present invention is applied to a CMOS transistor will be described in detail below with reference to the drawings. Incidentally, in this embodiment, for convenience of description, in the CMOS transistor including a pMOS transistor and an nMOS transistor, only the nMOS transistor will be shown diagrammatically and described in detail, and a detailed description of the pMOS transistor will be omitted. In this embodiment, the structure of the nMOS transistor will be described with a manufacturing method thereof.

FIGS. 1A and 1B to FIG. 7 are schematic sectional views showing the manufacturing method of the CMOS transistor according to the present embodiment step by step.

First, as shown in FIG. 1A, a silicon oxide film 2 and a silicon nitride film 3 are formed in sequence on a silicon substrate 1.

To put it in detail, the silicon oxide film 2 is formed on the surface of the clean silicon substrate 1, for example, by a CVD method. Thereafter, the silicon nitride film 3 is formed on the silicon oxide film 2, for example, by the CVD method. Since the total thickness of the silicon oxide film 2 and the silicon nitride film 3 here becomes almost equal to the thickness of a later-described low-resistance conductive layer, in order to form the low-resistance conductive layer with a desired thickness, it is, for example, a value within a range from 20 nm to 150 nm. Here, the thickness of the silicon oxide film 2 and the thickness of the silicon nitride film 3 are adjusted to about 10 nm and about 100 nm, respectively.

Figure 1B:
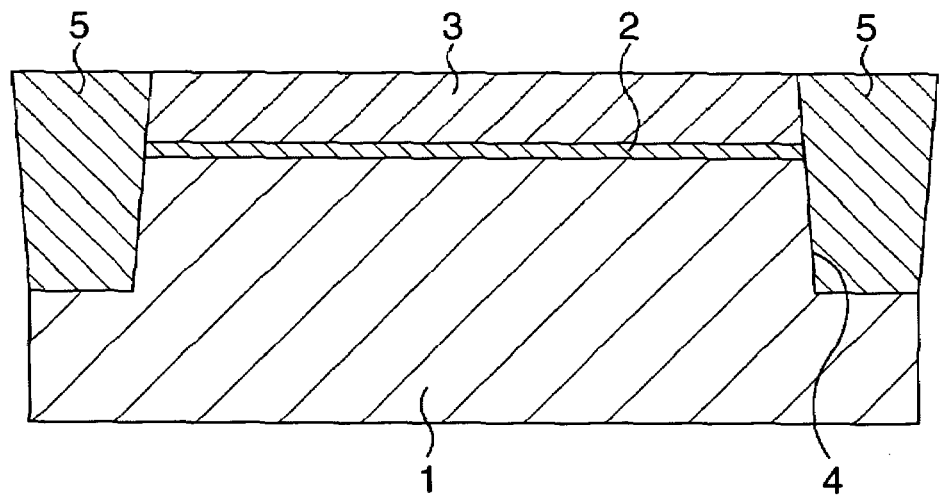

Subsequently, as shown in FIG. 1B, an STI element isolation structure 5 is formed to demarcate an element active region on the silicon substrate 1.

To be more precise, first, the silicon nitride film 3 and the silicon oxide film 2 in a portion corresponding to the element isolation region is etched by lithography and subsequent dry etching. Then, a resist pattern (not shown) used here is removed by ashing or the like, and the silicon substrate 1 is etched with the silicon nitride film 3 as a mask. At this time, an isolation trench 4, for example, with a depth of about 200 nm from the surface of the silicon nitride film 3 is formed from the silicon nitride film 3 to the silicon substrate 1.

Then, an insulator, here silicon oxide (not shown), is deposited, for example, with a thickness of about 300 nm over the entire surface of the silicon nitride film 3 so as to fill the isolation trench 4 by the CVD method with high step coverage, and with the silicon nitride film 3 as a polishing stopper, the silicon oxide is polished and planarized, for example, by CMP (Chemical-Mechanical Polishing) until the surface of the silicon nitride film 3 is exposed. By this polishing, the STI element isolation structure 5 which is formed by filling the isolation trench 4 with the oxide silicon is obtained. This STI element isolation structure 5 is formed to have such a shape that its upper portion protrudes from the surface of the silicon substrate 1 by the total thickness of the silicon oxide film 2 and the silicon nitride film 3.

Figure 2A:
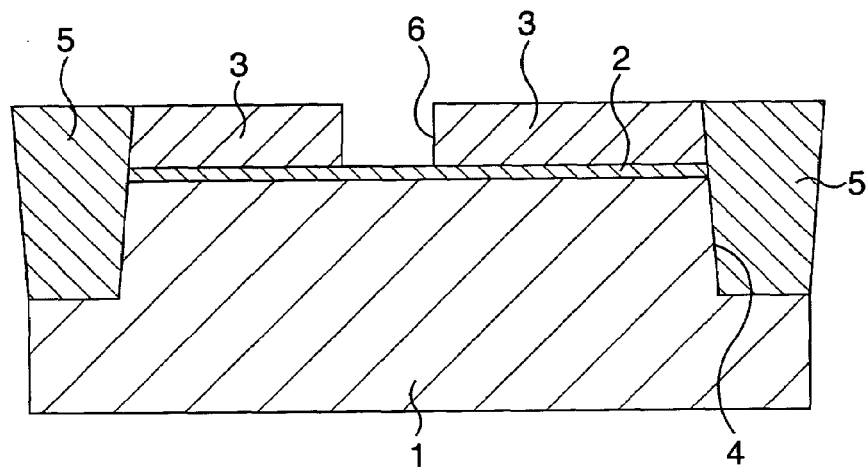
FIG. 2A and FIG. 2B are schematic sectional views subsequent to FIG. 1B, showing the manufacturing method of the CMOS transistor according to the present embodiment step by step.

Subsequently, as shown in FIG. 2A, an electrode trench 6 is formed in the silicon nitride film 3.

To put it in detail, continuously using the silicon oxide film 2 and the silicon nitride film 3, the silicon nitride film 3 is processed by lithography and subsequent dry etching to remove a portion of the silicon nitride film 3 corresponding to a later-described gate electrode forming portion, thereby forming the electrode trench 6.

Figure 2B:
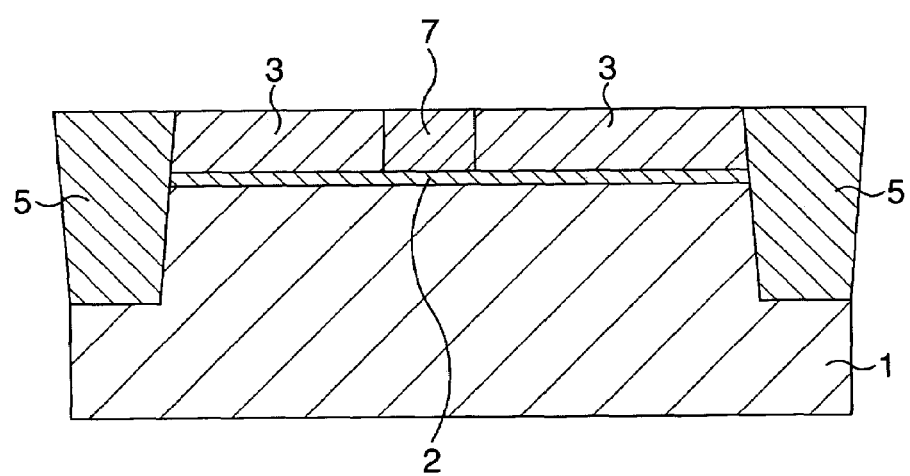

Thereafter, as shown in FIG. 2B, a dummy electrode pattern 7 which fills the electrode trench 6 is formed.

To put it in detail, polycrystalline silicon is deposited on the silicon nitride film 3 so as to fill in the electrode trench 6, for example, by the CVD method. Here, in place of the polycrystalline silicon, a material having a different polishing rate from the silicon nitride film 3 such as amorphous silicon, an insulator other than silicon nitride (such as oxide silicon), or the like may be used.

Then, with the silicon nitride film 3 as a polishing stopper, the polycrystalline silicon is polished and planarized, for example, by CMP until the surface of the silicon nitride film 3 is exposed. By this polishing, the dummy electrode pattern 7 which is formed by filling the electrode trench 6 with the polycrystalline silicon is obtained.

Figure 3A:
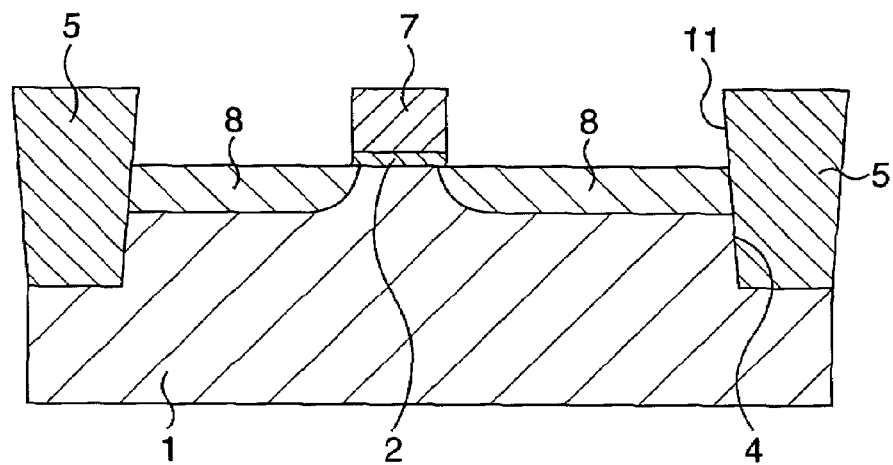
FIG. 3A and FIG. 3B are schematic sectional views subsequent to FIG. 2B, showing the manufacturing method of the CMOS transistor according to the present embodiment step by step.

Subsequently, as shown in FIG. 3A, after the silicon nitride film 3 and the silicon oxide film 2 thereunder are removed, a source/drain 8 is formed.

To be more precise, first, the silicon nitride film 3 and the silicon oxide film 2 thereunder are removed by wet etching. At this time, a gap portion 11 from which the surface of the silicon substrate 1 is exposed is formed between the STI element isolation structure 5 and the dummy electrode pattern 7.

Thereafter, an impurity is ion-implanted into both sides of the dummy electrode pattern 7 in the element active region, that is, the surface of the silicon substrate 1 exposed from the gap portions 11, and annealing to activate the impurity is performed thereon to form the source/drain 8. As ion implantation conditions, for example, phosphorus ($P^+$) is used as an n-type impurity, and ion implantation is performed at an acceleration energy of 7 keV and a dose amount of $1\times10^{16}/cm^2$. Incidentally, as concerns the pMOS transistor, for example, boron ($B^+$) is used as a p-type impurity, and ion implantation is performed at an acceleration energy of 3 keV and a dose amount of $5\times10^{15}/cm^2$. Here, for example, after, first of all, $P^+$ is ion-implanted into an nMOS transistor forming region while only a pMOS transistor forming region is covered with a resist, the resist is removed, and then $B^+$ is ion-implanted into the pMOS transistor forming region while only the nMOS transistor forming region is covered with a resist. Thereafter, the resist is removed. As a heat treatment condition, for example, spike annealing is performed, for example, at about 1000° C.

Figure 3B:
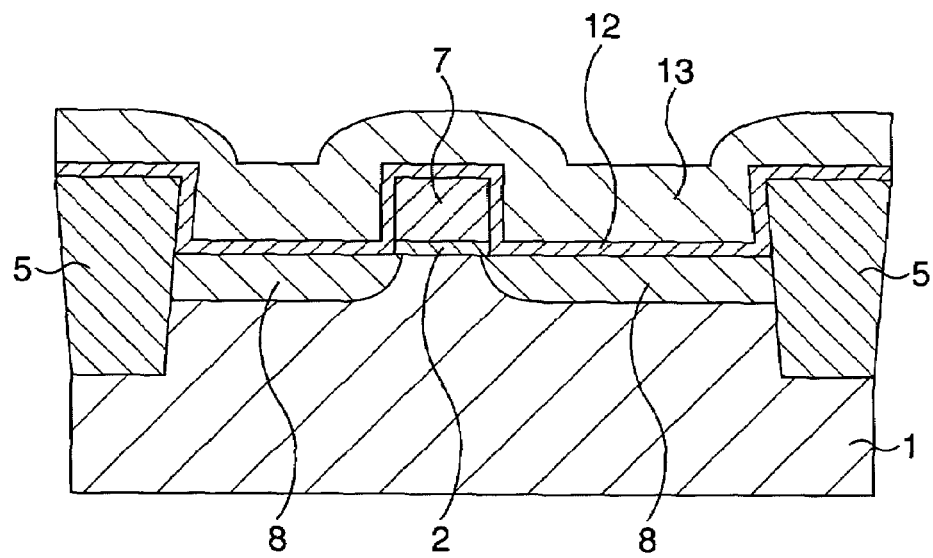

Then, as shown in FIG. 3B, an adhesive film 12 and a low-resistance conductive material 13 are deposited so as to fill in the gap portion 11.

To put it in detail, first, a natural oxide film (not shown) produced on the surface of the silicon substrate 1 exposed from the gap portion 11 is removed, and thereafter the adhesive film 12 is deposited with a thickness of about 5 nm so as to cover a portion from the surface of the dummy electrode pattern 7 to an inner wall of the gap portion 11, for example, by a thermal CVD method with high step coverage.

Subsequently, for example, by the thermal CVD method, the low-resistance conductive material 13 is deposited, for example, with a thickness of about 200 nm over the entire surface so as to fill in the gap portion 11 with the adhesive layer 12 therebetween.

Here, as a material for the low-resistance conductive material 13, at least one kind selected from the group consisting of tungsten (W) and titanium nitride (TiN) is used. Further, corresponding to the low-resistance conductive material, as a material for the adhesive film 12, at least one kind selected from the group consisting of tungsten nitride (WN) and titanium tungsten nitride (TiWN) is used. In this embodiment, a case where WN and W are used as materials for the adhesive film 12 and the low-resistance conductive layer 13, respectively is shown as an example.

Figure 4A:
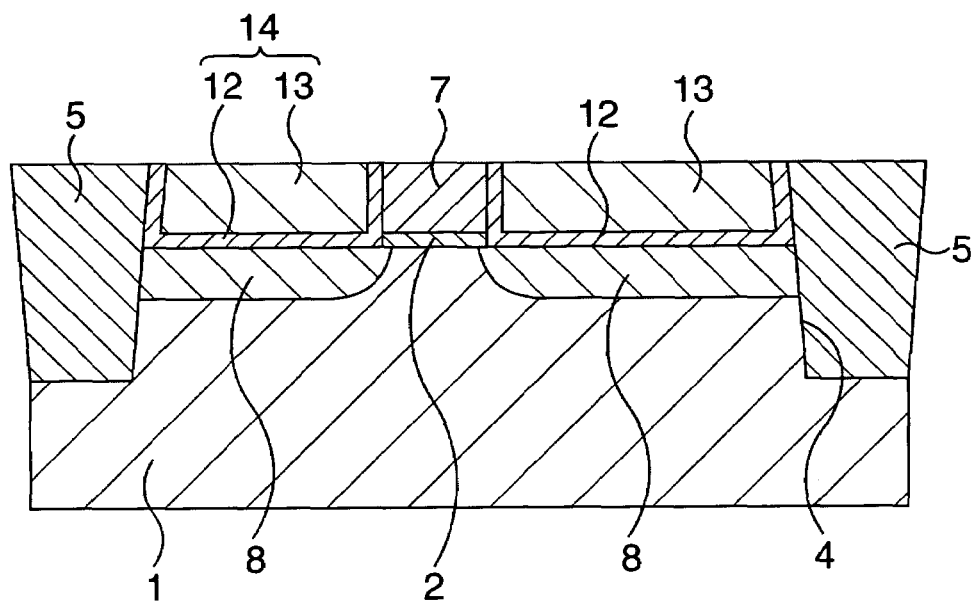
FIG. 4A and FIG. 4B are schematic sectional views subsequent to FIG. 3B, showing the manufacturing method of the CMOS transistor according to the present embodiment step by step.

Thereafter, as shown in FIG. 4A, the adhesive film 12 and the low-resistance conductive material 13 are processed in a self-aligned manner to form a low-resistance conductive layer 14.

To be more precise, for example, by CMP, the adhesive film 12 and the low-resistance conductive material 13 are polished and planarized with the dummy electrode pattern 7 and the STI element isolation structure 5 as a polishing stopper until the surfaces of the dummy electrode pattern 7 and the STI element isolation structure 5 are exposed. By this polishing, the low-resistance conductive layer 14 formed by filling the gap portion 11 with the adhesive film 12 and the low-resistance conductive material 13 is formed in a self-aligned manner. By filling the gap portion 11 mainly with the low-resistance conductive material 13, this low-resistance conductive layer 14 with a relatively thick thickness (here, about 100 nm) almost equal to a depth of the gap portion 11 (a height of a protruding portion from the surface of the substrate of the STI element isolation structure 5) is aligned with and electrically correctly connected with the source/drain 8, and functions as a source/drain electrode which reduces a resistance value of the source/drain 8.

Figure 4B:
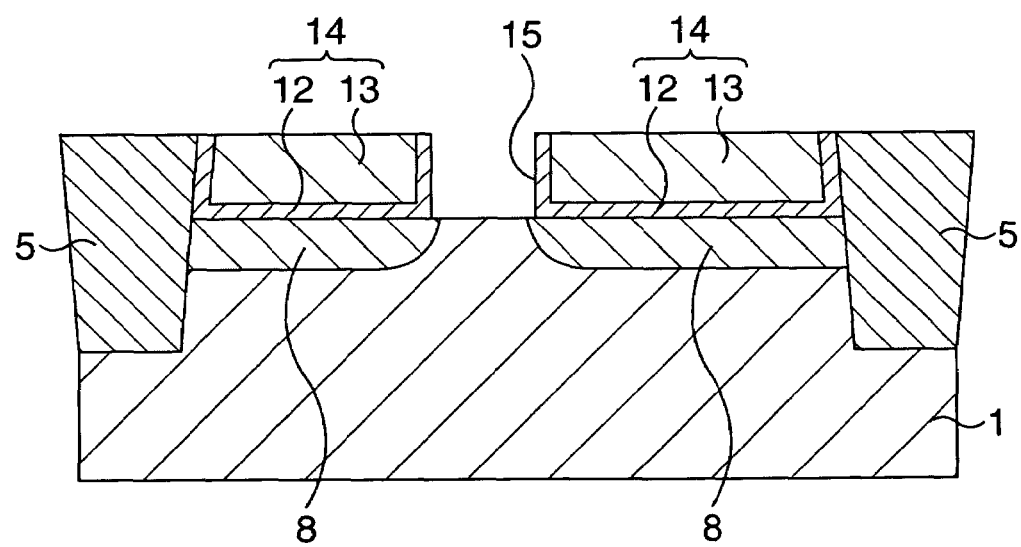

Then, as shown in FIG. 4B, the dummy electrode pattern 7 and the silicon oxide film 2 thereunder are removed.

To put it in detail, the dummy electrode pattern 7 and the silicon oxide film 2 thereunder are removed by etching. At this time, a portion of a surface layer of the STI element isolation structure 5 is sometimes etched, but since the etching amount is relatively very small, a change in the shape of the STI element isolation structure 5 is negligible. This etching is performed on condition that an etching selection ratio between the dummy electrode pattern 7 and the silicon oxide film 2 and the silicon substrate 1 is maintained so that the surface of the silicon substrate 1 under the silicon oxide film 2 is not etched. A gap portion 15 having an electrode shape is formed by removing the dummy electrode pattern 7 and the silicon oxide film 2.

Figure 5A:
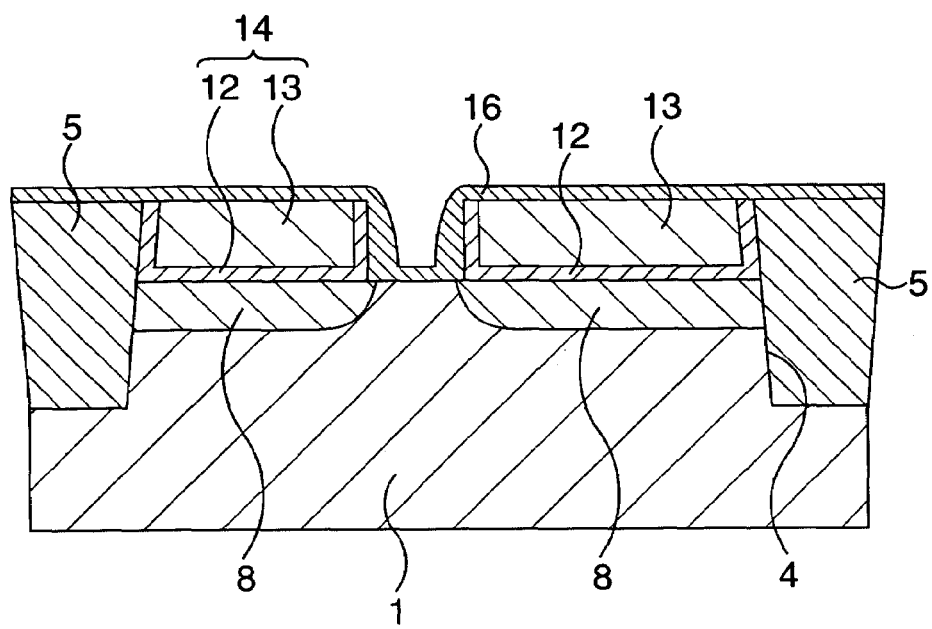
FIG. 5A and FIG. 5B are schematic sectional views subsequent to FIG. 4B, showing the manufacturing method of the CMOS transistor according to the present embodiment step by step.

Subsequently, as shown in FIG. 5A, a silicon oxide film 16 is formed over the entire surface.

To be more precise, by the thermal CVD method, an insulating film, here the silicon oxide film 16, is deposited with a thickness of about 30 nm over the entire surface so as to cover an inner wall surface of the gap portion 15.

Figure 5B:
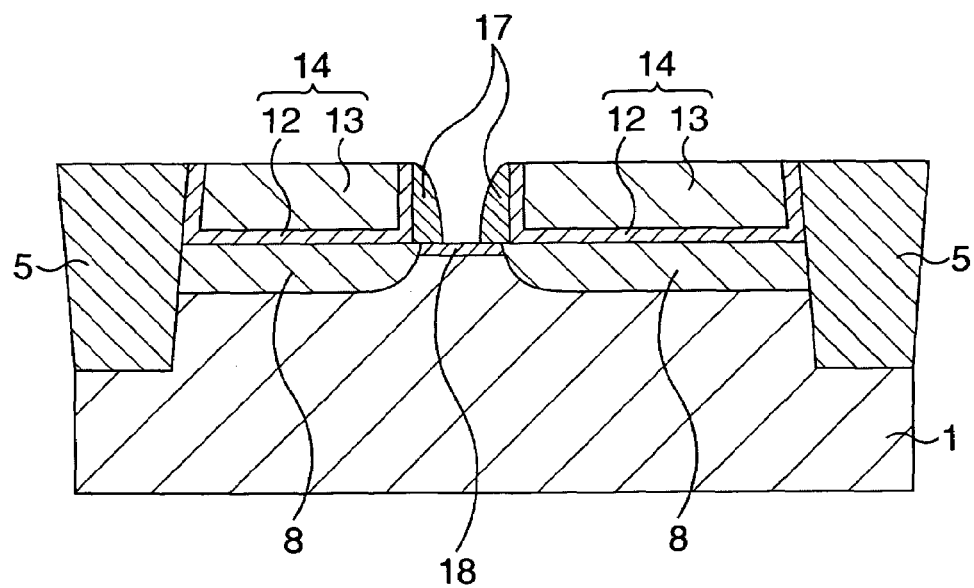

Thereafter, as shown in FIG. 5B, after the silicon oxide film 16 is processed to form a sidewall structure 17, a channel dose layer 18 is formed.

To put it in detail, first, the entire surface of the silicon oxide film 16 is anisotropically dry etched to leave silicon oxide only on a side surface of the low-resistance conductive layer 4 in the gap portion 15, thereby forming the sidewall structure 17. This etching is performed on condition that an etching selection ratio between the silicon oxide film 16 and the silicon substrate 1 is maintained so that the surface of the silicon substrate 1 as a base is not etched.

Then, an impurity to form a channel is ion-implanted into the surface of the silicon substrate 1 exposed from the gap portion 15, and annealing to activate the impurity is performed thereon to form the channel dose layer 18. As ion implantation conditions, for example, boron ($B^+$) is used as a p-type impurity, and ion implantation is performed at an acceleration energy of 1 keV and a dose amount of $1\times10^{12}/cm^2$. Incidentally, as concerns the PMOS transistor, for example, phosphorus ($P^+$) is used as an n-type impurity, and ion implantation is performed at an acceleration energy of 3 keV and a dose amount of $1\times10^{12}/cm^2$. Here, for example, after, first of all, $B^+$ is ion-implanted into the nMOS transistor forming region while only the pMOS transistor forming region is covered with a resist, the resist is removed, and then $P^+$ is ion-implanted into the pMOS transistor forming region while only the nMOS transistor forming region is covered with a resist. Thereafter, the resist is removed. As a heat treatment condition, for example, spike annealing is performed, for example, at about 950° C.

Figure 6A:
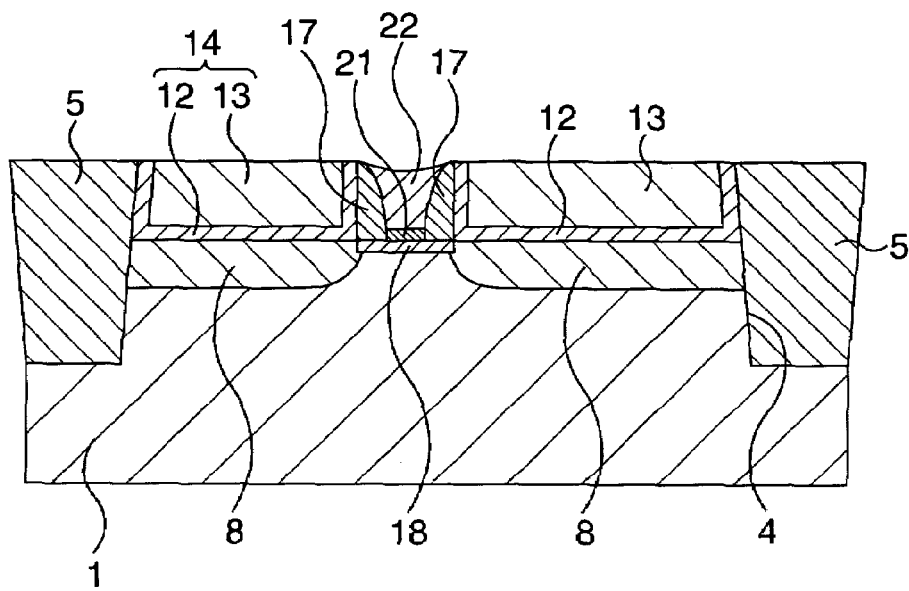
FIG. 6A and FIG. 6B are schematic sectional views subsequent to FIG. 5B, showing the manufacturing method of the CMOS transistor according to the present embodiment step by step.

Subsequently, as shown in FIG. 6A, a gate insulating film 21 and a gate electrode 22 are formed in the gap portion 15.

To be more precise, first, an insulating film (not shown) is deposited with a thickness of about 2 nm over the entire surface including a portion on a bottom surface of the gap portion 15, for example, by the CVD method. As a material for this insulating film, for example, $HfSiO_x$ is used. Then, plasma nitriding treatment is performed.

Thereafter, for example, by the CVD method, a conductive material (not shown) is deposited with a thickness of about 50 nm over the entire surface so as to fill in the gap portion 15 with the insulating film therebetween. As this conductive material, for example, TiN is used.

Then, for example, by CMP, the conductive material and the insulating film are polished and planarized with the STI element isolation structure 5 as a polishing stopper until the surface of the STI element isolation structure 5 is exposed. By this polishing, the gate electrode 22 formed by filling the gap portion 21 with the conductive material with the gate insulating film 21 therebetween and electrically insulated from the conductive layer 14 by the sidewall structure 17 is formed in a self-aligned manner. Here, by selecting a condition under which a polishing rate of the gate electrode 22 is higher than that of the sidewall structure 17 and making slight overpolishing, the gate electrode 22 is formed slightly lower than the conductive layer 14, and insulation performance between the conductive layer 14 and the gate electrode 22 by the sidewall structure 17 is maintained.

Figure 6B:
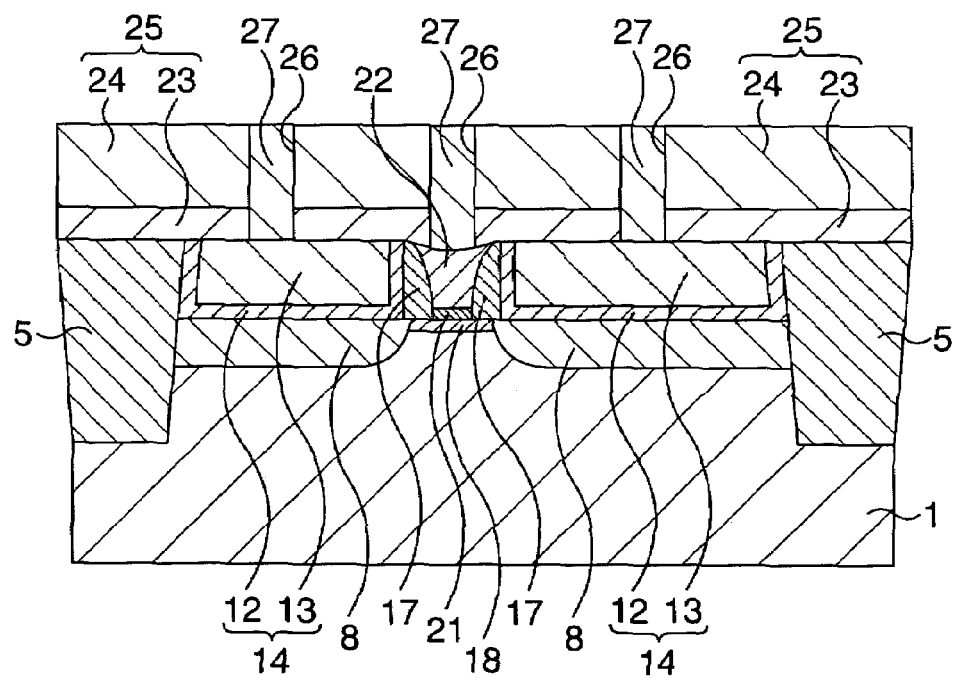

Subsequently, as shown in FIG. 6B, a W plug 27 which is electrically connected to an interlayer insulating film 25 and the conductive layer 14 is formed.

To put it in detail, first, by the CVD method or the like, a silicon nitride film 23 and a silicon oxide film 24 are deposited with thicknesses of about 50 nm and about 400 nm, respectively, so as to cover the entire surface to form the interlayer insulating film 25.

Thereafter, the interlayer insulating film 25 is processed by lithography and subsequent dry etching in such a manner that a portion of the surface of the conductive layer 14 is exposed, thereby forming a contact holes 26. Then, by the CVD method or the like, a wiring material, here W (not shown), is deposited on the interlayer insulating film 25 so as to fill in these contact holes 26. Subsequently, with the surface of the interlayer insulating film 25 as a polishing stopper, W is polished and planarized until the surface of the interlayer insulating film 25 is exposed. By this polishing, the W plug 27 formed by filling the contact hole 26 with W and electrically connected with the conductive layer 14 is obtained.

Figure 7:
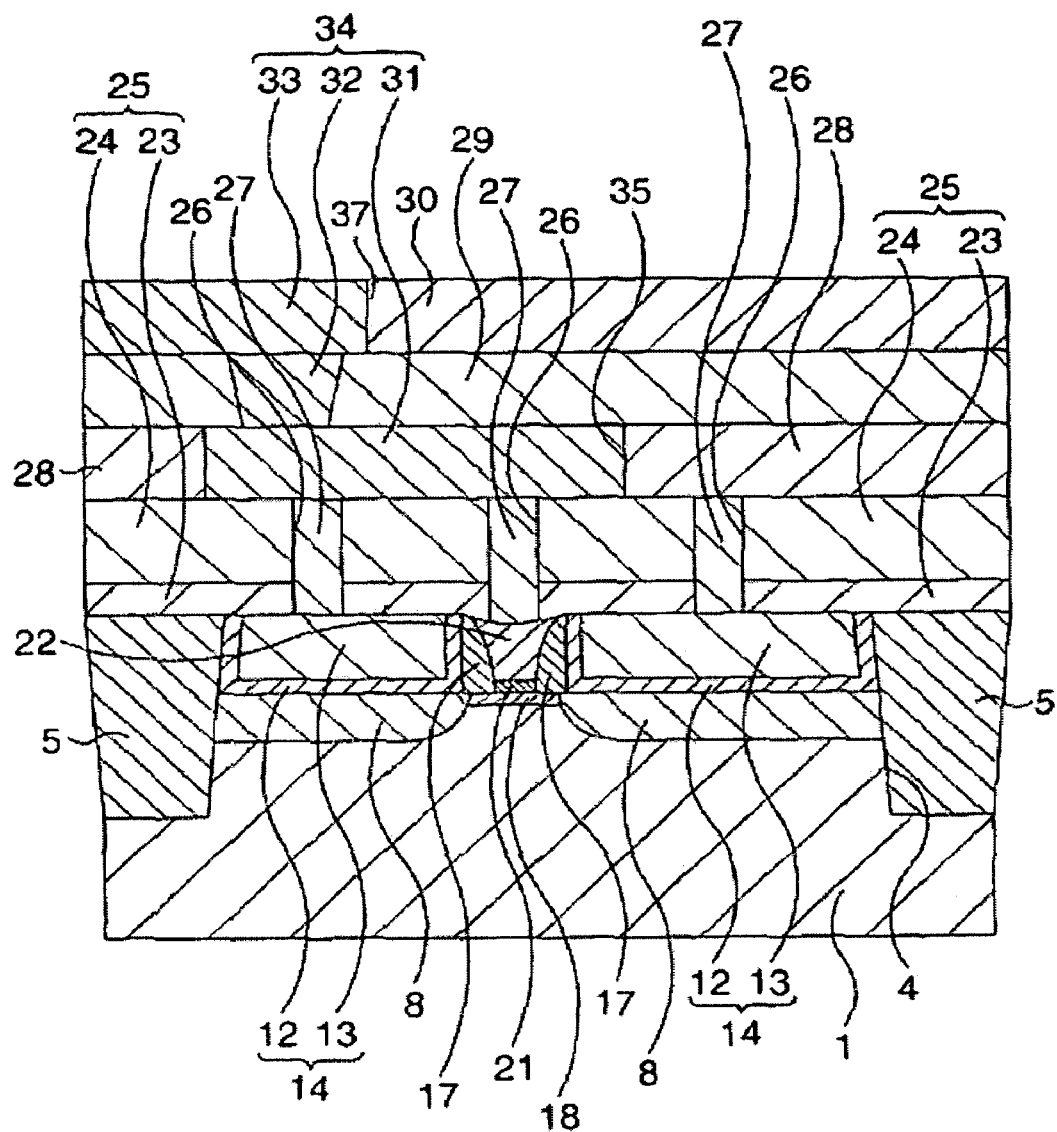
FIG. 7 is a schematic sectional view subsequent to FIG. 6B, showing the manufacturing method of the CMOS transistor according to the present embodiment step by step.

Thereafter, as shown in FIG. 7, a wiring structure 34 which is electrically connected with the W plug 27 is formed by a so-called damascene method.

To be more precise, first, a wiring 31 is formed by a single damascene method.

Namely, by the CVD method or the like, silicon oxide or the like is deposited so as to cover the entire surface to form an interlayer insulating film 28 with a thickness of about 150 nm.

Then, the interlayer insulating film 28 is processed by lithography and subsequent dry etching to form a wiring trench 35 having a wiring shape in the interlayer insulating film 28 in such a manner that the surface of the W plug 27 which requires wiring connection is exposed. Subsequently, a plating seed layer (not shown) is formed, and the wiring trench 35 is filled with Cu (or a Cu alloy material) by a plating method. Thereafter, with the surface of the interlayer insulating film 28 as a polishing stopper 35, Cu is polished and planarized. By this planarization, the wiring 31 formed by filling the wiring trench 35 with Cu and electrically connected with the desired W plug 27 is obtained.

Then, a via portion 32 is formed.

Namely, by the CVD method or the like, silicon oxide or the like is deposited so as to cover the entire surface to form an interlayer insulating film 29 with a thickness of about 200 nm.

Subsequently, the interlayer insulating film 29 is processed by lithography and subsequent dry etching to form a via hole 36 in the interlayer insulating film 29 in such a manner that the surface of the wiring 31 is exposed. Thereafter, Cu/TaN is deposited, for example, by the CVD method so as to fill in the via hole 36. Then, with the surface of the interlayer insulating film 29 as a polishing stopper, Cu is polished and planarized by CMP. By this planarization, the via portion 32 formed by filling the via hole 36 with CU and connected with the wiring 31 is obtained.

Subsequently, a wiring 33 is formed by the single damascene method.

Namely, by the CVD method or the like, silicon oxide or the like is deposited so as to cover the entire surface to form an interlayer insulating film 30 with a thickness of about 150 nm.

Thereafter, the interlayer insulating film 30 is processed by lithography and subsequent dry etching to form a wiring trench 37 having a wiring shape in the interlayer insulating film 30 in such a manner that the surface of the via portion 32 is exposed. Then, a plating seed layer (not shown) is formed, and the wiring trench 37 is filled with Cu (or a Cu alloy material) by the plating method. Subsequently, with the surface of the interlayer insulating film 30 as a polishing stopper, Cu is polished and planarized by CMP. By this planarization, the wiring 33 formed by filling the wiring trench 37 with Cu and connected with the via portion 32 is obtained.

Thus, the wiring structure 34 in which the wirings 31 and 33 are electrically connected via the via portion 32 is finished.

Incidentally, the case where the wiring 33 is formed by the single damascene method is described here, but a so-called dual damascene method in which the via hole and the wiring trench are simultaneously filled with Cu by the plating method may be used.

Thereafter, through the formation of a further interlayer insulating film, an upper wiring, a protective film (all not shown), and so on, the CMOS transistor according to the present embodiment is brought to completion.

As described above, according to the present embodiment, the CMOS transistor which suppresses an increase in junction leakage current without causing erosion of the source/drain 8 or the like to thereby fully reduce a resistance value of the source/drain 8, attains further scale down and higher integration, and makes a high-speed operation at low power consumption possible is realized.

Modified Example

Now, a modified example of the present embodiment will be described.

Figure 8:
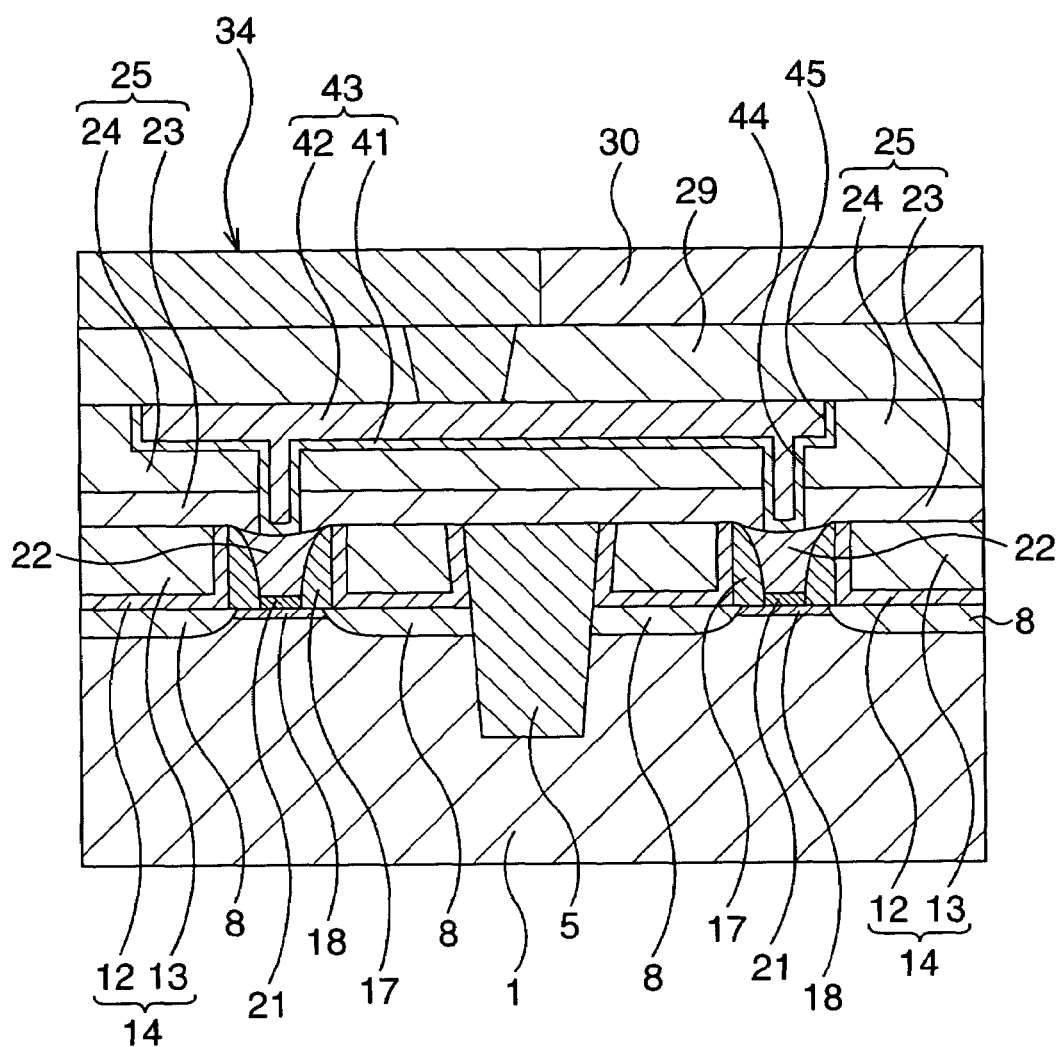
FIG. 8 is a schematic sectional view (a sectional view along a direction orthogonal to a longitudinal direction of a gate electrode) showing the structure of an nMOS transistor which is a constituent element of a CMOS transistor according to a modified example of the present embodiment.
Figure 9:
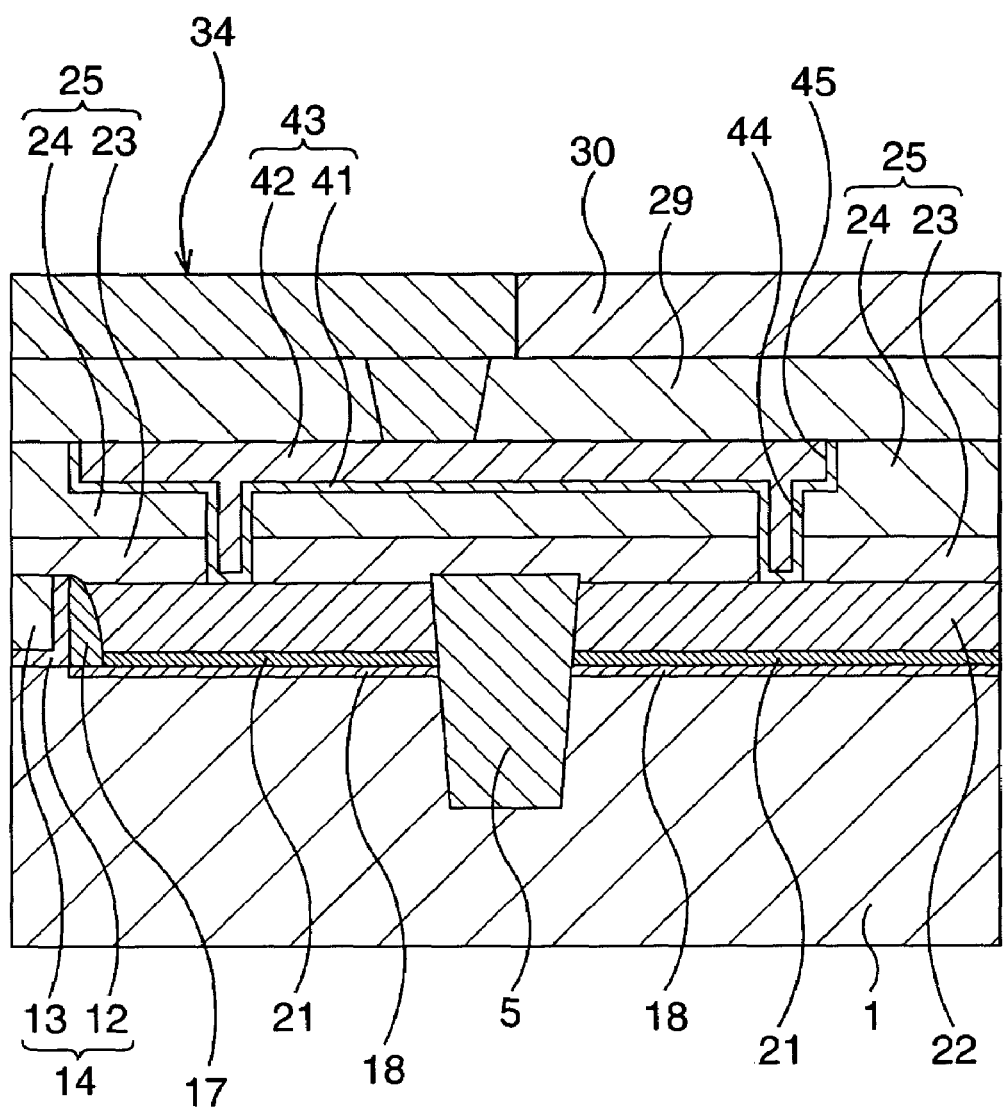
FIG. 9 is a schematic sectional view (a sectional view along the longitudinal direction of the gate electrode) showing the structure of the nMOS transistor which is the constituent element of the CMOS transistor according to the modified example of the present embodiment.

FIG. 8 and FIG. 9 are schematic sectional views showing the structure of an nMOS transistor as a constituent element of a CMOS transistor according to the modified example of the present embodiment, FIG. 8 shows a section along a direction orthogonal to a longitudinal direction of a gate electrode, and FIG. 9 shows a section along the longitudinal direction of the gate electrode, respectively.

Although in this embodiment, a device structure and a manufacturing method are the same as those described in the present embodiment, a CMOS transistor corresponding to a case where from the necessity for the circuit design of a semiconductor device, gate electrodes need to be connected locally will be shown as an example. Incidentally, the same numerals and symbols are used to designate the same constituent members corresponding to those in the present embodiment, and a description thereof will be omitted.

In this example, similarly to the present embodiment, first, respective processes in FIG. 1A to FIG. 6A are undergone.

Then, the interlayer insulating film 25 is formed. In the CMOS transistor (here, only an nMOS transistor is shown) of this example, as shown in FIG. 8 and FIG. 9, the gate electrodes 22, which are formed in element active regions adjacent to each other with the STI element isolation structure 5 therebetween, are electrically connected by a wiring structure 43.

The wiring structure 43 is formed by a so-called dual damascene method.

To put it in detail, first, the interlayer insulating film 25 is processed by lithography and subsequent dry etching to form via holes 44 from which the respective surfaces of the adjacent gate electrodes 22 are exposed and a wiring trench 45 which is integral with the via holes 44.

Subsequently, for example, by the thermal CVD method, an adhesive film 41, for example, WN is deposited with a thickness of about 5 nm so as to cover inner walls of the wiring trench 45 and the via holes 44.

Thereafter, for example, by the thermal CVD method, W 42 is deposited with a thickness of about 200 nm over the entire surface so as to fill in the wiring trench 45 and the via holes 44 with the adhesive film 41 therebetween.

Then, for example, by CMP, with the interlayer insulating film 25 as a polishing stopper, the adhesive film 41 and the W 42 are polished and planarized until the surface of the interlayer insulating film 25 is exposed. By this polishing, the wiring structure 43 formed by filling the wiring trench 45 and the via holes 44 with the adhesive film 41 and the W42 is obtained.

Thereafter, similarly to the description using FIG. 7 in the present embodiment, the interlayer insulating films 29 and 30 and the wiring structure 34 are formed, and through the formation of a further interlayer insulating film, an upper wiring, a protective film (all not shown), and so on, the CMOS transistor according to this example is brought to completion.

As described above, according to this example, in addition to various effects produced in the present embodiment, even when the gate electrodes 22 adjacent to each other need to be electrically connected in terms of circuit design, the CMOS transistor can be manufactured without causing any disadvantage and increase in process steps. This advantage realizes the CMOS transistor which attains further scale down and higher integration and makes a high-speed operation at low power consumption possible.

According to the present invention, a semiconductor device which suppresses an increase in junction leakage current without causing erosion of an impurity diffusion region or the like to thereby fully reduce a resistance value of the impurity diffusion region, attains further scale down and higher integration, and makes a high-speed operation at low power consumption possible is realized.

The present embodiment is to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
    a semiconductor substrate;
    an element isolation structure having an isolation trench formed in an element isolation region in said semiconductor substrate with an insulator and in which an upper portion of the insulator protrudes from a surface of said semiconductor substrate;
    a gate electrode in an electrode shape formed over an element active region demarcated by said element isolation structure of said semiconductor substrate with a gate insulating film therebetween;
    a pair of impurity diffusion regions formed in a surface layer of said semiconductor substrate adjacent to both sides of said gate electrode in the element active region;
    a conductive layer comprising a conductive material with an adhesive layer, formed in a region between said element isolation structure and said gate electrode and over the element active region in such a manner as to be electrically insulated from said gate electrode and electrically connected with said impurity diffusion region; and
    a channel dose layer having an upper surface planar with uppermost surfaces of said pair of impurity diffusion regions, wherein
    a top surface of said element isolation structure and said conductive layer are planar to form a flat surface;
    said conductive material is at least one material selected from the group consisting of tungsten and titanium nitride; and
    an upper surface of said gate electrode is a concave surface, and middle portion of the upper surface is lower than that of the top surface of said element isolation structure.

2. The semiconductor device according to claim 1, wherein an insulating film is formed between said element isolation structure and said gate electrode.

3. The semiconductor device according to claim 2, wherein the insulating film is a sidewall structure which covers a side wall of said element isolation structure with an insulator.

4. The semiconductor device according to claim 1, wherein a thickness of said conductive layer is a value within a range from 20 nm to 150 nm.

5. The semiconductor device according to claim 1, further comprising a wiring which electrically connects said gate electrode to another gate electrode adjacent to said gate electrode with said element isolation structure therebetween.

6. The semiconductor device according to claim 5, wherein said wiring is a damascene structure which is formed by filling a wiring trench formed in an interlayer insulating film covering said gate electrode with a conductive substance.

7. The semiconductor device according to claim 1, wherein a material for the adhesive layer is WN or TiWN.

8. A semiconductor device, comprising:
    a semiconductor substrate;

an element isolation structure having an isolation trench formed in an element isolation region in said semiconductor substrate with an insulator and in which an upper portion of the insulator protrudes from a surface of said semiconductor substrate;

a gate electrode in an electrode shape formed over an element active region demarcated by said element isolation structure of said semiconductor substrate with a gate insulating film therebetween;

a pair of impurity diffusion regions formed in a surface layer of said semiconductor substrate adjacent to both sides of said gate electrode in the element active region; and a conductive layer comprising a conductive material with an adhesive layer, formed in a region between said element isolation structure and said gate electrode and over the element active region in such a manner as to be electrically insulated from said gate electrode and electrically connected with said impurity diffusion region, wherein a top surface of said element isolation structure and said conductive layer are planar to form a flat surface;

said gate insulating film has a lower surface planar below said flat surface;

said conductive material is at least one material selected from the group consisting of tungsten and titanium nitride; and an upper surface of said gate electrode is a concave surface, and middle portion of the upper surface is lower than that of the top surface of said element isolation structure.

9. The semiconductor device according to claim 8, wherein an insulating film is formed between said element isolation structure and said gate electrode.

10. The semiconductor device according to claim 9, wherein the insulating film is a sidewall structure which covers a side wall of said element isolation structure with an insulator.

11. The semiconductor device according to claim 8, further comprising a wiring which electrically connects said gate electrode to another gate electrode adjacent to said gate electrode with said element isolation structure therebetween.

12. The semiconductor device according to claim 8, wherein a thickness of said conductive layer is a value within a range from 20 nm to 150 nm.

13. The semiconductor device according to claim 8, wherein a material for the adhesive layer is WN or TiWN.

* * * * *

UNITED STATES PATENT AND TRADEMARK OFFICE
CERTIFICATE OF CORRECTION

PATENT NO.        : 7,586,134 B2                                       Page 1 of 1
APPLICATION NO.   : 11/362220
DATED             : September 8, 2009
INVENTOR(S)       : Inagaki et al.

It is certified that error appears in the above-identified patent and that said Letters Patent is hereby corrected as shown below:

On the Title Page:
In item (73) change "Fujitsu Microelectronics Lmiited" to be -- Fujitsu Microelectronics Limited --

Signed and Sealed this

Twenty-seventh Day of April, 2010

David J. Kappos
*Director of the United States Patent and Trademark Office*